US 6,657,616 B2

(12) United States Patent
Sims

(10) Patent No.: US 6,657,616 B2
(45) Date of Patent: Dec. 2, 2003

(54) CAPACITIVE TOUCH KEYBOARD

(75) Inventor: Michael J. Sims, Holland, MI (US)

(73) Assignee: Invensys Appliance Controls Company, Holland, MI (US)

( * ) Notice: Subject to any disclaimer, the term of this patent is extended or adjusted under 35 U.S.C. 154(b) by 196 days.

(21) Appl. No.: 09/809,974

(22) Filed: Mar. 16, 2001

(65) Prior Publication Data

US 2002/0130848 A1 Sep. 19, 2002

(51) Int. Cl.[7] ............................................. B06K 11/06
(52) U.S. Cl. ................................... 345/173; 178/18.01
(58) Field of Search .............................. 345/173, 174; 178/18.01–18.03, 18.05, 18.06, 19.03; 455/90

(56) References Cited

U.S. PATENT DOCUMENTS

| | | | | |
|---|---|---|---|---|
| 4,526,043 A | * | 7/1985 | Boie et al. | 73/862.046 |
| 5,008,497 A | * | 4/1991 | Asher | 178/18.05 |
| 5,159,159 A | * | 10/1992 | Asher | 178/18.05 |
| 5,457,289 A | * | 10/1995 | Huang et al. | 178/18.08 |
| 5,760,715 A | * | 6/1998 | Senk et al. | 341/33 |
| 6,246,862 B1 | * | 6/2001 | Grivas et al. | 455/566 |
| 6,373,265 B1 | * | 4/2002 | Morimoto et al. | 324/686 |
| 2003/0014210 A1 | * | 1/2003 | Vock et al. | 702/149 |

* cited by examiner

*Primary Examiner*—Bipin Shalwala
*Assistant Examiner*—Nitin Patel
(74) *Attorney, Agent, or Firm*—Richard L. Sampson, Esq.; Robert J. Hampsch, Esq.

(57) ABSTRACT

A touch sensor is provided which detects manual contact by a user to actuate a controlled device. The touch sensor includes a substrate, an RF signal transmitter including a plurality of first conductors, and an RF signal receiver including a plurality of second conductors. The first and second conductors are located in spaced, interdigitated alignment with one another on the substrate, to form a key having a geometry which affords substantial coverage thereof by a human appendage. The RF signal receiver includes an RF signal amplifier electrically coupled to the second conductors. A processor is electrically coupled to the RF signal receiver to detect variations in signal strength corresponding to coverage of the key by a human appendage to selectively actuate the controlled device.

18 Claims, 2 Drawing Sheets

CAPACITIVE TOUCH KEYBOARD

BACKGROUND OF THE INVENTION

1. Technical Field

This invention relates to touch sensors, and more particularly to rigid flat panel touch-sensitive sensors.

2. Background Information

Touch sensors or touch panels are used in various applications to replace conventional mechanical switches; e.g., kitchen stoves, microwave ovens, and the like. Unlike mechanical switches, these sensors contain no moving parts to break or wear out. Also, touch sensors are easily cleaned due to the lack of openings and cavities which tend to collect dirt and other contaminants.

Conventional capacitive touch sensing systems employ a passive form of detection. In such a sensor, a capacitive circuit is driven by a source signal. A key touch, representing a change to the circuit capacitance, results in attenuating the potential, and the resulting voltage level change indicates a key touch. This capacitive circuit is often implemented by the deposition of opposing conductive key pads to opposite sides of a dielectric element.

One problem with conventional sensors is that accumulation of foreign deposits on the key pads has the drawback of negating the effect of a touch by the user. Chemicals and abrasion of the exposed key pads may also degrade performance. Also, different dielectric characteristics, such as thickness and dielectric constant, often result in having to change or redesign the size of the key pads to achieve the same capacitance for a different dielectric element in identical applications.

Moreover, some known touch panels use a high impedance design which may cause the touch panel to malfunction when water or other liquids are present on the substrate. This presents a problem in areas where liquids are commonly found, such as a kitchen. Since the pads have a higher impedance than the water, the water acts as a conductor for the electric fields created by the touch pads. Thus, the electric fields follow the path of least resistance; i.e., the water. Also, due to the high impedance design, static electricity may cause the touch panel to malfunction. The static electricity is prevented from quickly dissipating because of the high touch pad impedance.

Also, many existing touch panels use additional elements, such as transistors, disposed integrally or proximate to each key pad, adding complexity to the touch sensor.

Thus, a need exists for an improved touch-sensitive sensor that addresses one or more of the drawbacks of the prior art.

SUMMARY

According to an embodiment of this invention, a touch sensor detects manual contact by a user to actuate a controlled device. The touch sensor includes a substrate, an RF signal transmitter including a plurality of first conductors, and an RF signal receiver including a plurality of second conductors. The first and second conductors are located in spaced, interdigitated alignment with one another on the substrate, to form a key having a geometry which affords substantial coverage thereof by a human appendage. The RF signal receiver includes an RF signal amplifier electrically coupled to the second conductors. A processor is electrically coupled to the RF signal receiver to detect variations in signal strength corresponding to coverage of the key by a human appendage to selectively actuate the controlled device.

In another embodiment of the inventions, a touch sensor is provided to detect user contact to actuate a controlled device. The touch sensor includes a substrate, an RF signal transmitter including a RF signal generator and plurality of first conductors, and an RF signal receiver including a plurality of second conductors. The first and second conductors are disposed in spaced, interdigitated alignment with one another on the substrate, to form a key having a geometry which affords substantial coverage thereof by a human appendage. The RF signal receiver includes an RF signal amplifier electrically coupled to the second conductors. A processor is electrically coupled to the RF signal receiver to detect variations in signal strength corresponding to selective coverage of the key by a human appendage to selectively actuate the controlled device. The RF signal receiver receives a baseline signal when the first and second conductors are free from the coverage, and the RF signal receiver receives an activation signal which is discrete from the baseline signal upon the coverage. An absolute value of the activation signal is less than an absolute value of the baseline signal.

In a still further embodiment of the present invention, a method is provided for detecting manual contact by a user to actuate a controlled device. The method includes the steps of providing a substrate, providing an RF signal transmitter including a two or more first conductors, and providing an RF signal receiver including a two or more second conductors coupled to an RF signal amplifier. First and second conductors are located in spaced, interdigitated alignment with one another on the substrate, to form a key having a geometry which affords substantial coverage thereof by a human appendage. A processor is electrically coupled to the RF signal receiver. The processor is used to detect variations in signal strength corresponding to selective coverage of the key by a human appendage to selectively actuate the controlled device.

BRIEF DESCRIPTION OF THE DRAWINGS

The above and other features and advantages of this invention will be more readily apparent from a reading of the following detailed description of various aspects of the invention taken in conjunction with the accompanying drawings, in which.

DETAILED DESCRIPTION

Figure 1:
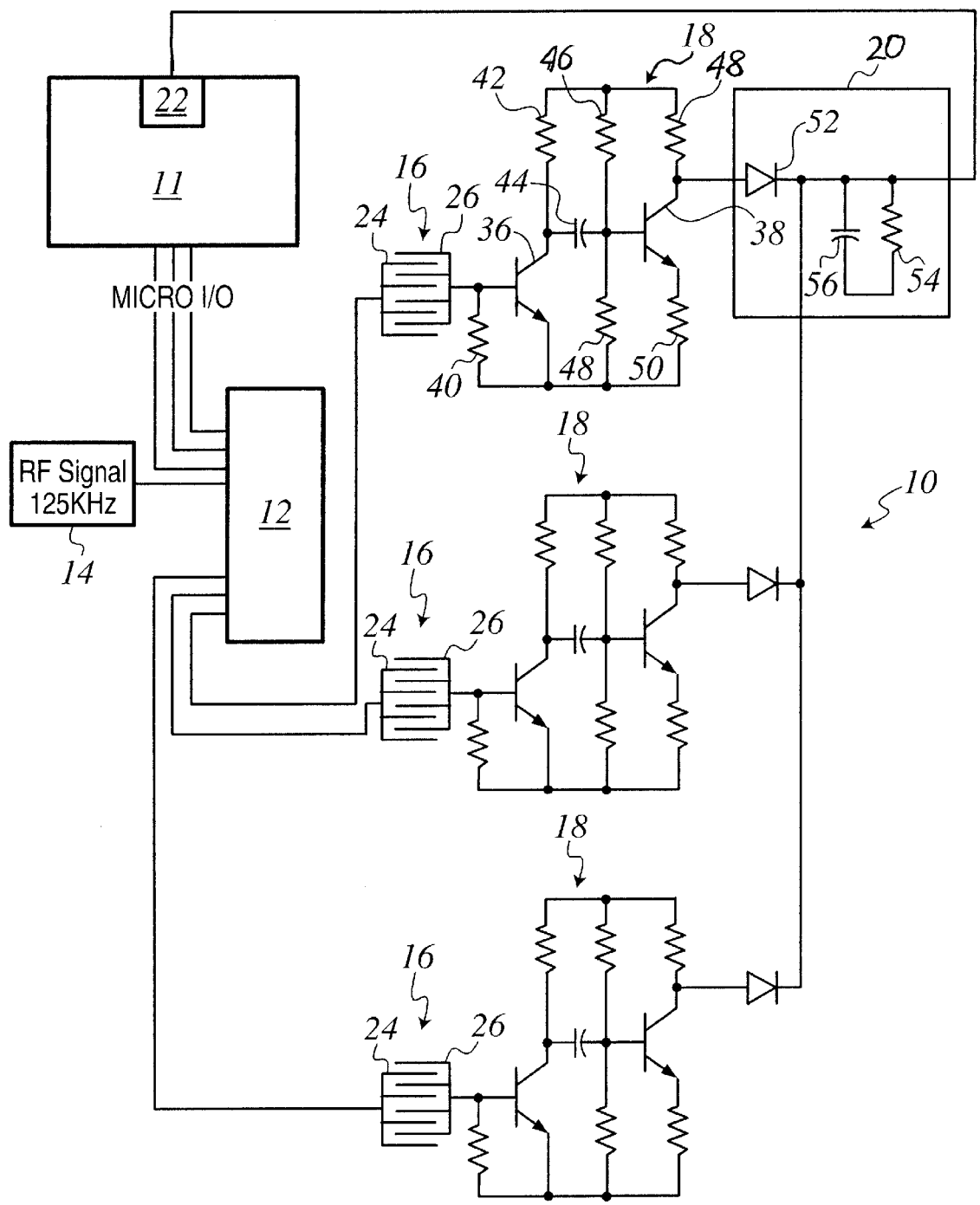
FIG. 1 is a schematic circuit diagram of a sensor of the present invention.

Referring to the figures set forth in the accompanying Drawings, the illustrative embodiments of the present invention will be described in detail hereinbelow. For clarity of exposition, like features shown in the accompanying drawings shall be indicated with like reference numerals and similar features as shown in alternate embodiments in the drawings shall be indicated with similar reference numerals.

Figure 2:
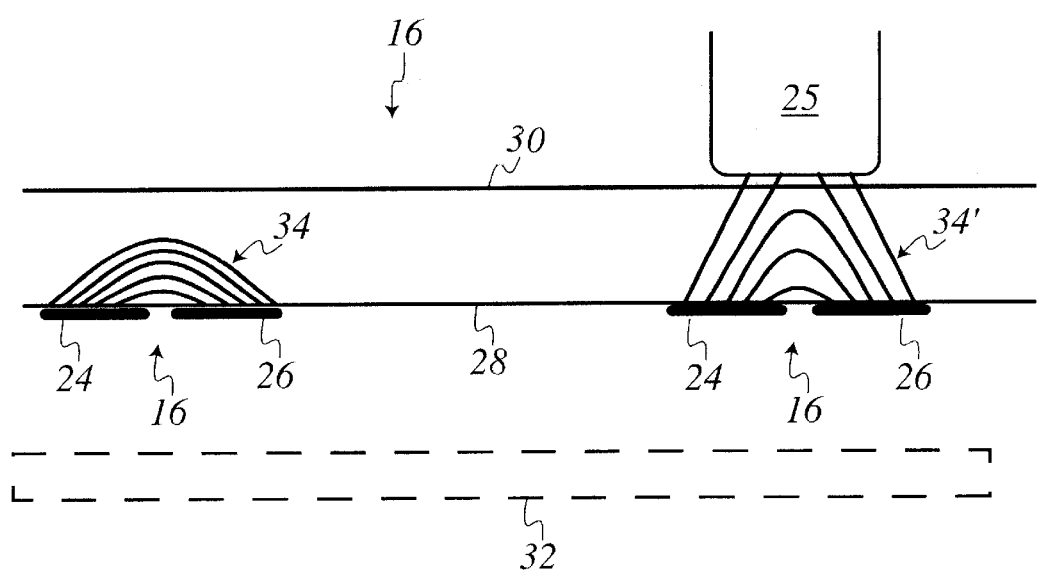
FIG. 2 is an elevational schematic view of key pad portions of the sensor of FIG. 1, with one key pad being actuated by a user.

Referring to FIGS. 1 and 2, the apparatus constructed according to the principles of the present invention is shown. Turning to FIG. 1, the present invention is a capacitive keyboard interface system 10 that advantageously does not require any surface preparation on either side of the keyboard dielectric 30. The invention thus eliminates any requirement for coatings commonly used on conventional glass keyboards. The invention also advantageously allows other substrates to be used as a keyboard interface and may further operate as a non-contact keyboard. The present invention uses a loosely coupled RF circuit to sense the presence of an external body (such as a finger) 25 (FIG. 2). The coupler 16 includes inter-digitated traces (conductors) 24 and 26 on a substrate 28 that is preferably superposed with a non-metallic dielectric 30. Once a finger 25 is placed proximate the RF Coupler 16, the coupled signal is reduced since a portion of it is diverted (i.e., 'grounded') by the external body 25. Rather than using conventional 'field effect' approaches that use a digital pulse or strobe and then measure the capacitance between electrodes, the present invention advantageously functions as a radio frequency (RF) transmitter/receiver combination. This transmitter effectively broadcasts continuously, and uses a decrease in received signal strength to determine a key press. Advantageously, by requiring a relatively large body to reduce a baseline signal, the present invention substantially eliminates false keypress signals such as typically generated by water on the key pads of high dielectric prior art sensors discussed hereinabove.

Specific aspects of an exemplary implementation of the present invention will be discussed in greater detail hereinbelow.

Referring to FIG. 2, coupler (key) 16 includes interdigitated conductors 24 and 26 disposed on any suitable substrate 28. Examples of substrates include a conventional circuit board, polyester sheet, glass, or plastic. Conductors 24 and 26 may conveniently be formed using conventional printed circuit board technology. The non-metallic dielectric 30 is superposed with the substrate 28 between the substrate and a user 25. Dielectric 30 may be any thin, nonconductive material, such as glass, plastic, fiberglass, etc. In addition, display indicia, such as numerals, may be incorporated (e.g., printed) onto the dielectric 30. Alternatively, desired indicia may be provided by use of a conventional display 32, such as a Liquid Crystal Display (LCD), or Light Emitting Diode (LED) display. The display 32 may be located in any convenient location, such as superposed behind the couplers 16 (i.e., on the opposite side of couplers 16 relative to the dielectric 30).

Although the coupler 16 is shown and described having a discrete substrate 28 and dielectric 30, the skilled artisan will recognize that a single component 28 may serve as both the substrate onto which the conductors 24 and 26 are disposed, and as the dielectric which may be contacted by a user 25, without departing from the spirit and scope of the present invention.

During operation, in the absence of actuation by a user 25, RF energy 34 passes between conductors 24 and 26. When the user 25 touches the front surface of dielectric 30 in superposition with a particular key 16, a portion of the RF energy, as shown at 34', is drawn to (i.e., effectively 'grounded' by) the user 25. This reduction in signal strength serves as in indication of a keypress.

Referring back to FIG. 1, an embodiment of the present invention will be more fully described. As shown, a microprocessor 11 uses an analog multiplexer 12 (e.g., an industry standard 4051 or 74C4051 Mux available from Texas Instruments, Inc. (Dallas, Tex.)) to cycle a signal from an RF signal generator 14 through coupler ('key') 16 and into an amplifier 18. Signal generator 14 may be any conventional oscillator source that generates a relatively high frequency, e.g., 100 KHz to 125 KHz or more. As shown, the signal generator 14 is supplied as an input to a "one of eight" analog Mux 12 to supply the signal to eight keys 16. The selected output of the Mux 12 is fed to the conductor 24 of the coupler (key) 16. This conductor 24 effectively serves as a radio antenna or transmitter portion to transmit the Radio Frequency signal, as shown at 34 in FIG. 2, to conductor 26. Conductor 26 similarly functions as a receiving antenna or receiver portion of the present invention. The amount of signal 34 that is lost through this capacitive transmission/reception is dependent on the geometry of the sensor 16 and its surrounding dielectric. Thus, if a change in dielectric is present, such as provided by the finger of a user 25, then some energy will be lost through coupling to the finger 25, such as shown as 34' (FIG. 2), and will not be received by conductor 26, thus dampening or attenuating the signal received by conductor 26.

The mechanism that results in such dampening is well known to those skilled in the art. Briefly described, when an object, such as a finger 25, comes in contact with the glass (dielectric) 30, some of the energy is drawn away, such as shown at 34'. Any sufficiently large object, such as a human body 25, has the capability to create its own "ground". This is why one receives a static shock even though not touching something that is grounded (even if wearing insulative shoes). When the user touches the front surface of the glass, some of the current that is passing between the contacts 24 and 26 is effectively "grounded" through the dielectric to the user. This causes the output current to drop and is detected by the microprocessor. The reactance of the capacitive sensor key 16 also changes, contributing to the reduced signal.

The skilled artisan will recognize that amplifier 18 may be any conventional high impedance, high gain amplifier, such as an FET, BiPolar, Op-Amp (Operational Amplifier). Amplifier 18 thus functions similarly to a conventional high gain RF front-end amplifier used in a radio receiver. In the embodiment shown, amplifier 18 includes an NPN transistor 36 and a PNP transistor 38, that advantageously provide relatively high gain at relatively low cost.

As also shown, the transistors are configured as a conventional common emitter amplifier. Resistor 40 on the base of transistor 36 helps keep the transistor's base from floating due to static charge. Resistor 42 on the collector of transistor 36 limits the current through the transistor 36. The capacitor 44 between the transistors 36 and 38 nominally eliminates the DC bias on the amplified signal. The two resistors 46 and 48 on the base of the second transistor 38 address the DC biasing of this transistor. The resistor 48 on the emitter of transistor 38 limits the gain and the resistor 50 on the collector limits the current.

The amplified signal is fed into a peak detector 20, which as shown, includes a diode 52, and a resistor 54 and capacitor 56 pair. The diode 52 is used to convert the AC RF signal into a DC signal. This DC signal is filtered by resistor 54 and capacitor 56. Any suitable voltage source (not shown) may be used for the amplifier, provided the voltage used does not exceed the specified voltage of the individual components. For example, a source supplying 12 to 15 Volts DC may be used.

The resulting DC signal is then fed into an A/D (analog to digital) converter 22 of the microprocessor 11. The A/D converter converts the incoming signal to a digital value. The microprocessor 11 then uses the incoming steady state digital signal from A/D 22 to set and store a (individual) base line value for each key 16. This base line value is then compared with subsequent scans. In a preferred embodiment, if the signal generated by a particular key changes slowly, the stored value will track this new value. This advantageously allows for small changes in ambient environment, such as temperature changes and/or accumulation of dirt on the surface of the dielectric 30, to be compensated. This approach also advantageously permits a different baseline to be stored for each key, to compensate for differences in individual keys, such as geometry and circuit path length. A relatively large negative change in signal level is interpreted by microprocessor 11 as a keypress. Subsequently, if a relatively large positive change is detected, then this is interpreted as a keypress de-activation. As mentioned hereinabove, eight keys 16 are provided in the embodiment shown, using an 8 to 1 Mux 12 (with only three keys 16 shown). However, the skilled artisan will recognize that any desired number of keys 16 may be used, without departing from the spirit and scope of the present invention.

In the preceding specification, the invention has been described with reference to specific exemplary embodiments thereof. It will be evident that various modifications and changes may be made thereunto without departing from the broader spirit and scope of the invention as set forth in the claims that follow. The specification and drawings are accordingly to be regarded in an illustrative rather than restrictive sense.

Having thus described the invention, what is claimed is:

1. A touch sensor for detecting manual contact by a user for actuating a controlled device, the touch sensor comprising:
   a substrate;
   an RF signal transmitter including a plurality of first conductors;
   an RF signal receiver including a plurality of second conductors;
   said first and second conductors disposed in spaced, interdigitated alignment with one another on the substrate, to form a key having a geometry which affords substantial coverage thereof by a human appendage;
   the RF signal receiver including an RF signal amplifier electrically coupled to the second conductors;
   a processor electrically coupled to the RF signal receiver to detect variations in signal strength corresponding to selective coverage of said key by a human appendage to selectively actuate the controlled device.

2. The sensor of claim 1, wherein the RF signal transmitter further comprises an RF signal generator.

3. The sensor of claim 2, comprising a plurality of keys.

4. The sensor of claim 3, wherein the keys are arranged in a matrix.

5. The sensor of claim 2, comprising a multiplexer coupled to the RF signal generator and to RF signal transmitters of a plurality of keys, wherein the RF signal generator is sequentially coupled to each of the RF signal transmitters.

6. The sensor of claim 5, wherein said processor is electrically coupled to said multiplexer and controls operation of said multiplexer.

7. The sensor of claim 1, further comprising a dielectric material superposed with said substrate, said dielectric adapted for said engagement by the human appendage during said coverage.

8. The sensor of claim 1, wherein the amplifier comprises a common emitter amplifier having an NPN transistor and a PNP transistor.

9. The sensor of claim 1, wherein the RF signal receiver further comprises a peak detector electrically coupled to the RF signal amplifier.

10. The sensor of claim 9, wherein said peak detector comprises a diode disposed in series with a resistor/capacitor pair.

11. The sensor of claim 10, further comprising an A/D converter coupled to said peak detector.

12. The sensor of claim 11, wherein said A/D converter is coupled to the processor.

13. The sensor of claim 12, wherein the RF signal transmitter further comprises an RF signal generator.

14. The sensor of claim 13, comprising a multiplexer coupled to the RF signal generator and to the RF signal transmitters of a plurality of keys, wherein the RF signal generator is sequentially coupled to each of the RF signal transmitters, said processor being electrically coupled to said multiplexer to control operation of said multiplexer.

15. The sensor of claim 1, wherein the substrate is glass.

16. The sensor of claim 1, wherein the substrate is plastic.

17. A touch sensor for detecting manual contact by a user for actuating a controlled device, the touch sensor comprising:
   a substrate;
   an RF signal transmitter including a RF signal generator and plurality of first conductors;
   an RF signal receiver including a plurality of second conductors;
   said first and second conductors disposed in spaced, interdigitated alignment with one another on the substrate, to form a key having a geometry which affords substantial coverage thereof by a human appendage;
   the RF signal receiver including an RF signal amplifier electrically coupled to the second conductors;
   a processor electrically coupled to the RF signal receiver to detect variations in signal strength corresponding to selective coverage of said key by a human appendage to selectively actuate the controlled device;
   wherein the RF signal receiver receives a baseline signal when the first and second conductors are free from said coverage, and the RF signal receiver receives an activation signal which is discrete from the baseline signal upon said coverage, and an absolute value of the activation signal is less than an absolute value of the baseline signal.

18. A method for detecting manual contact by a user for actuating a controlled device, the method comprising the steps of:
   (a) providing a substrate;
   (b) providing an RF signal transmitter including a plurality of first conductors;
   (c) providing an RF signal receiver including a plurality of second conductors coupled to an RF signal amplifier;
   (d) disposing the first and second conductors in spaced, interdigitated alignment with one another on the substrate, to form a key having a geometry which affords substantial coverage thereof by a human appendage;
   (e) electrically coupling a processor to the RF signal receiver;
   (f) using the processor to detect variations in signal strength corresponding to selective coverage of said key by a human appendage to selectively actuate the controlled device.

* * * * *